United States Patent [19]

Tanaka et al.

[11] Patent Number: 5,258,281

[45] Date of Patent: Nov. 2, 1993

[54] HEAT-DEVELOPABLE PHOTOSENSITIVE MATERIAL

[75] Inventors: Hiromi Tanaka, Atsugi; Tetsuro Fukui, Kawasaki; Motokazu Kobayashi, Yokohama; Kenji Kagami, Atsugi; Masao Suzuki, Tokyo; Tetsuya Higuchi, Hiratsuka, all of Japan

[73] Assignee: Canon Kabushiki Kaisha, Tokyo, Japan

[21] Appl. No.: 790,502

[22] Filed: Nov. 12, 1991

[30] Foreign Application Priority Data

Nov. 14, 1990 [JP] Japan .................................. 2-306188
Apr. 15, 1991 [JP] Japan .................................. 3-108173

[51] Int. Cl.$^5$ .............................................. G03C 1/00
[52] U.S. Cl. ..................................... 430/619; 430/617; 430/353; 430/259
[58] Field of Search ............... 430/617, 619, 260, 353, 430/259, 618, 620

[56] References Cited

U.S. PATENT DOCUMENTS

| | | | |
|---|---|---|---|
| 2,681,294 | 6/1954 | Beguin | 430/523 |
| 3,409,438 | 11/1968 | Lokken | 430/617 |
| 3,635,719 | 1/1972 | Ohkuby et al. | 430/350 |
| 3,909,271 | 9/1975 | Ikenoue et al. | 430/619 |
| 4,081,279 | 3/1978 | Goffe et al. | 430/620 |
| 4,123,274 | 10/1978 | Knight et al. | 430/336 |
| 4,220,709 | 9/1980 | de Mauriac | 430/353 |
| 4,460,678 | 7/1984 | Yu et al. | 430/346 |
| 4,649,098 | 3/1987 | Takeda | 430/270 |
| 5,001,032 | 3/1991 | Katayuma et al. | 430/203 |
| 5,004,667 | 4/1991 | Arahara et al. | 430/255 |
| 5,064,744 | 12/1991 | Fukui et al. | 430/255 |

FOREIGN PATENT DOCUMENTS

| | | | |
|---|---|---|---|
| 326424 | 8/1989 | European Pat. Off. | |
| 43-4921 | 2/1968 | Japan . | |
| 43-4924 | 2/1968 | Japan . | |
| 44-30270 | 12/1969 | Japan . | |
| 45-18416 | 6/1970 | Japan . | |
| 55-50246 | 4/1980 | Japan . | |
| 57-064230 | 4/1982 | Japan | 430/617 |
| 58-118638 | 7/1983 | Japan . | |
| 58-118639 | 7/1983 | Japan . | |
| 59-55429 | 3/1984 | Japan . | |
| 3-135564 | 6/1991 | Japan . | |
| WO81/00922 | 4/1981 | PCT Int'l Appl. . | |
| WO88/04797 | 6/1988 | PCT Int'l Appl. . | |

OTHER PUBLICATIONS

Research Disclosure 21206, Dec. 1981, "Image-Transfer Reversal Emulsions and Elements with Incorporated Quinones", pp. 433–434.
Patent Abstracts of Japan, vol. 10, No. 380 (P-528) Aug., 1986 for JPA 61-170741.

*Primary Examiner*—Charles L. Bowers, Jr.
*Assistant Examiner*—John A. McPherson
*Attorney, Agent, or Firm*—Fitzpatrick, Cella, Harper & Scinto

[57] ABSTRACT

A heat-developable photosensitive material which comprises an organic silver salt, a silver halide, a reducing agent and a heat development accelerator having a redox potential ranging from −1.2 V to +1.0 V on the basis of an AgCl/Ag electrode.

12 Claims, 2 Drawing Sheets

- ● PHOTOSENSITIVE MATERIAL G (EXAMPLE 4)
- ○ PHOTOSENSITIVE MATERIAL H (EXAMPLE 5)
- × PHOTOSENSITIVE MATERIAL I (COMPARATIVE EX.4)

- ▫ PHOTOSENSITIVE MATERIAL K (EXAMPLE 7)
- ◆ PHOTOSENSITIVE MATERIAL L (EXAMPLE 8)
- ■ PHOTOSENSITIVE MATERIAL M (COMPARATIVE EX.5)

HEAT-DEVELOPABLE PHOTOSENSITIVE MATERIAL

BACKGROUND OF THE INVENTION

1. Field of the Invention

The present invention relates to a heat-developable photosensitive material containing an organic silver salt.

2. Related Background Art

Conventional silver salt photography utilizing a photosensitive silver halide can achieve the excellent sensitivity, gradation, image-stability, etc., and as a recording technique has been most widely used in practice. This method, however, uses a wet process in the processing steps such as developing, fixing and washing, causing many problems on operability and safety, that is, the processing is labourious and time-consuming and chemicals used for the processing may give anxiety for influence on human bodies. Accordingly, it has been sought to provide a photosensitive material utilizing a photosensitive silver halide and capable of being processed by a dry process.

Researchers have been extensively made in relation to such dry processing photography, as disclosed in Japanese Patent Publications No. 43-4921, No. 43-4924, etc. These disclosures are concerned with a technique in which a photosensitive silver halide is used in a catalytic amount and a non-photosensitive organic silver salt is used as an image forming agent. The mechanism by which the organic silver salt acts as an image forming agent can be explained as follows: (1) Silver nuclei are produced from a photosensitive silver halide as a result of exposure, and they form a latent image. (2) The silver nuclei serve as a catalyst, the organic silver salt and the reducing agent cause oxidation-reduction reaction upon heating, and the organic silver salt is reduced to metallic silver, which forms a visible image.

As an example of methods of utilizing such a heat-developable photosensitive material, Japanese Laid-open Patent Application No. 55-50246 discloses a method in which a silver image is used as a mask. As a photosensitive material that can provide images having much better contrast than those with the silver image as a mask, Japanese Laid-open Patent Application No. 3-135564 discloses a photosensitive material capable of forming an image with a good contrast by utilizing light-absorbing properties of a resultant oxidized reducing agent.

In order to accelerate the speed of the development, it is hitherto known to mix a development accelerator such as an alkali agent or an alkali generator into a heat-developable photosensitive material. The development accelerator herein means a substance capable of decreasing the amount of energy required in development when a photosensitive material is exposed to a given amount of exposure light and then developed to obtain a given optical density, and capable of shortening the heating time in the heating step or lowering the heating temperature.

When, however, an alkali agent or alkali generator is used as the development accelerator as conventionally done, there are problems that fogging tends to occur and raw stock stability (the property of retaining the photographic performance of a photosensitive material as it is produced during the storage) is lowered.

SUMMARY OF THE INVENTION

The present invention was made in order to solve the above problems. An object thereof is to provide a heat-developable photosensitive material that can achieve a high speed development, can give an image with a high γ (gamma), and also can enjoy a high raw stock stability.

The heat-developable photosensitive material of the present invention comprises a support and a photosensitive layer provided thereon, wherein said photosensitive layer contains an organic silver salt, a silver halide, a reducing agent and a heat development accelerator having a redox potential ranging from $-1.2$ V to $+1.0$ V on the basis of an AgCl/Ag electrode.

DESCRIPTION OF THE PREFERRED EMBODIMENTS

Figure 1:
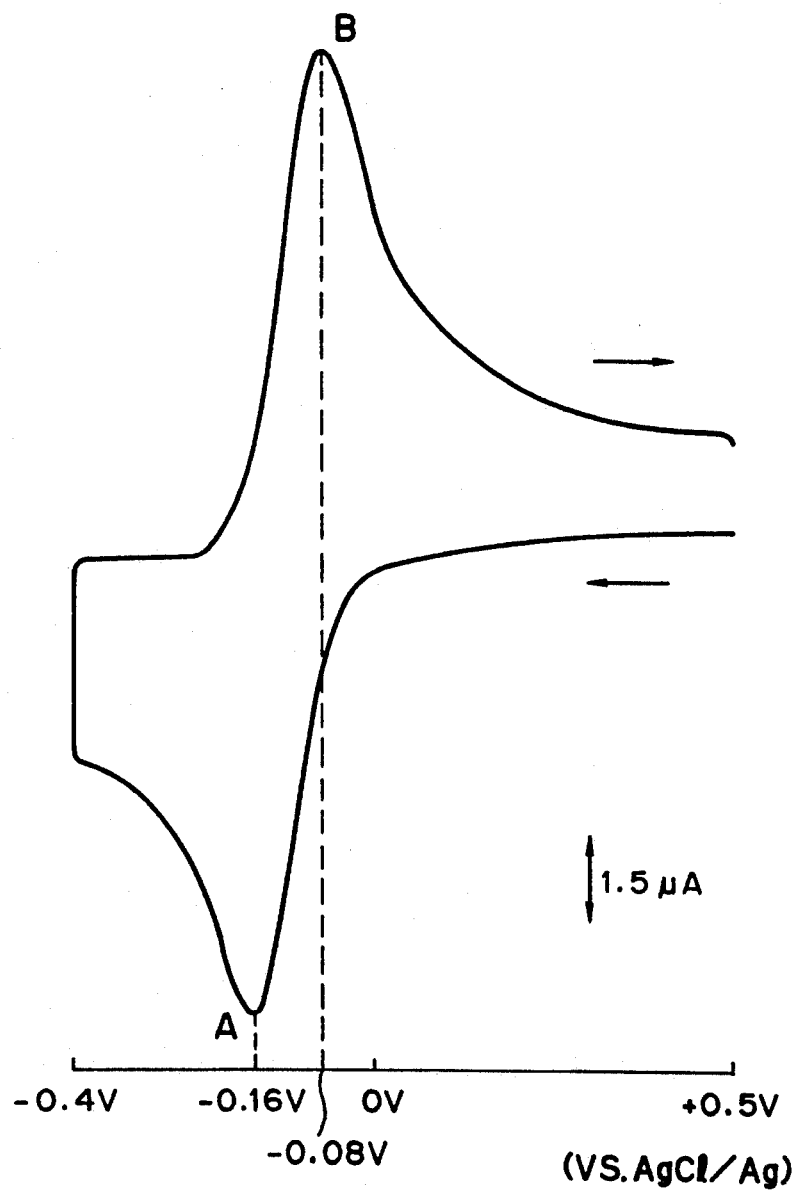
FIG. 1 is a graph to show an example of data obtained by measuring redox potential of a development accelerator used in the present invention.

The heat-developable photosensitive material of the present invention comprises a support and a photosensitive layer provided thereon. The photosensitive layer contains an organic silver salt, a silver halide, a reducing agent and a heat development accelerator having a redox potential ranging from $-1.2$ V to $+1.0$ V, and preferably ranging from $-0.8$ V to $+0.8$, on the basis of an AgCl/Ag electrode.

In the present invention, compounds having a redox potential ranging from $-1.2$ V to $+1.0$ V on the basis of an AgCl/Ag electrode act as the heat-development accelerator. Compounds having a redox potential lower than $-1.2$ V may give a small effect of heat development acceleration. Compounds having a redox potential more than $+1.0$ are not preferable since they may give an excessively great effect of heat development acceleration to cause fogging. As will be described later, the redox potential may also have a preferable range depending on the combination with the reducing agent.

In the present invention, the redox potential of the heat development accelerator is a value measured under the following conditions.

Solution temperature: 25° C.
Solvent: Acetonitrile
Electrolyte: Tetraethylammonium perchlorate, 0.1M
Working electrode: Platinum electrode of 3 mm in diameter
Reference electrode: AgCl/Ag
Opposing electrode: Platinum wire
Scanning speed: 100 mV/sec.

As the heat-development accelerator used in the present invention, it is preferred to use compounds having a dienone structure and having a redox potential ranging from $-1.2$ V to $+1.0$ V. Of the compounds having a dienone structure, quinoides, in particular, quinones or quinoimines are preferred.

The heat-developable photosensitive material of the present invention may preferably contain at least one heat-development accelerator represented by the following Formula (I), (II) or (III).

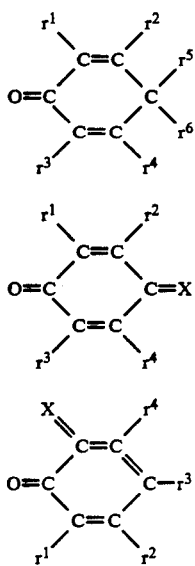

In the above Formulas (I), (II) and (III), $r^1$, $r^2$, $r^3$, $r^4$, $r^5$ and $r^6$ each independently represent a hydrogen atom, a halogen atom, a substituted or unsubstituted alkyl group, a substituted or unsubstituted aryl group, a substituted or unsubstituted cycloalkyl group, a substituted or unsubstituted aralkyl group, a substituted or unsubstituted alkoxyl group, a substituted or unsubstituted amino group or a cyano group, and $r^1$ and $r^2$, or $r^3$ and $r^4$, may together form a ring structure. X represents an oxygen atom, a substituted nitrogen or a substituted carbon atom. The compounds of Formulas (I), (II) and (III) may have, or need not have, absorption at the visible region.

In Formulas (I), (II) and (III), when $r^1$, $r^2$, $r^3$, $r^4$, $r^5$ or $r^6$ represents a halogen atom, they may include fluorine, chlorine, bromine and iodine.

Of the substituted or unsubstituted alkyl group, the unsubstituted alkyl group may preferably be a straight-chain or branched alkyl group having 1 to 18 carbon atoms, and more preferably 1 to 12 carbon atoms, including, for example, methyl, ethyl, propyl, i-propyl, butyl, t-butyl, i-butyl, amyl, i-amyl, secamyl, texyl, hexyl, heptyl, octyl, nonyl, dodecyl and stearyl.

The substituted alkyl group may preferably be an alkoxyalkyl group having 2 to 18 carbon atoms, and more preferably 2 to 12 carbon atoms, a halogenoalkyl group having 1 to 18 carbon atoms, and more preferably 1 to 12 carbon atoms, a hydroxyalkyl group having 1 to 18 carbon atoms, and more preferably 1 to 12 carbon atoms, or an aminoalkyl group having 1 to 18 carbon atoms, and more preferably 1 to 12 carbon atoms. For example, the alkoxyalkyl group may include methoxyethyl, ethoxymethyl, ethoxyethyl, ethoxypropyl, ethoxybutyl, propoxymethyl, propoxybutyl, i-propoxypentyl, t-butoxyethyl and hexyloxylbutyl.

The halogenoalkyl group may include, for example, chloromethyl, chloroethyl, bromoethyl, chloropropyl, chlorobutyl, chlorohexyl and chlorooctyl.

The hydroxyalkyl group may include, for example, hydroxymethyl, hydroxyethyl, hydroxypropyl, hydroxybutyl, hydroxypentyl, hydroxyhexyl and hydroxyheptyl.

The aminoalkyl group may include, for example, aminomethyl, acetylaminomethyl, dimethylaminomethyl, aminoethyl, acetylaminoethyl, dimethylaminoethyl, diethylaminoethyl, morpholinoethyl, piperidinoethyl, diethylaminopropyl, dipropylaminoethyl, acetylaminopropyl, aminobutyl and morpholinobutyl.

The substituted or unsubstituted aryl group may include phenyl, naphthyl, tolyl, hydroxyphenyl and chlorophenyl.

The substituted or unsubstituted cycloalkyl group may include, for example, cyclopentyl, cyclohexyl, cycloheptyl, methylcyclohexyl and dimethylcyclohexyl.

The substituted or unsubstituted aralkyl group may include, for example, benzyl, phenethyl, tolylmethyl, hydroxybenzyl, 2-hydroxy-3-methylbenzyl and 2-hydroxy-3-t-butylbenzyl.

The substituted or unsubstituted alkoxyl group may include, for example, methoxy, ethoxy, propoxy, butoxy, methoxyethoxy, methoxypropoxy, acetyloxyethoxy, acetyloxypropoxy, hydroxyethoxy and hydroxypropoxy.

The substituted or unsubstituted amino group may include, for example, amino, methylamino, dimethylamino, ethylamino, diethylamino, dibutylamino, pyrrolidino, acetylamino and benzosulfonamino.

The substituted nitrogen-containing group, represented by X in Formulas (II) and (III), may include, for example, phenylimino, tolylimino, naphthylimino, hydroxyphenylimino, dimethylaminophenylimino, diethylaminophenylimino, pyrrolidinophenylimino and chlorophenylimino. The substituted carbon may include, for example, phenylmethine, 3,5-dimethyl-4-hydroxyphenylmethine, 4-hydroxyphenylmethine, 3,5-di-t-butyl-4-hydroxyphenylmethine, 3,5-dimethoxy-4-hydroxyphenylmethine, 2-methoxyphenylmethine, dimethylaminomethine, diethylaminomethine and diphenylaminomethine.

Thus, the dienone compounds represented by the above Formulas (I), (II) and (III) can be exemplified by p-benzoquinone, o-benzoquinone, 2,5-dimethyl-p-benzoquinone, tetramethyl-p-benzoquinone, 2,6-dichloro-p-benzoquinone, tetraethyl-p-benzoquinone, 2,3-dimethoxy-5-methyl-p-benzoquinone, 2,3-dimethoxy-p-benzoquinone, 2-cyclohexyl-p-benzoquinone, 2,5-dichloro-p-benzoquinone, tetrachloro-p-benzoquinone, 2,5-dibromo-3,6-dimethyl-p-benzoquinone, 2,5-dibromo-3,6-dichloro-p-benzoquinone, chloranil, bromanil, 1,4-naphthoquinone, 2,3-dicyano-p-benzoquinone, 2,3-dicyano-5,6-dichlorobenzoquinone, 2,3-dimethyl-p-benzoquinone, 2,6-di-t-butyl-p-benzoquinone, 2-acetylaminobenzoquinone, 2,6-dimethyl-p-benzoquinone, 1,2-naphthoquinone, 2-methylnaphthoquinone, 2-ethylnaphthoquinone, 2-chloronaphthoquinone, 2-cyclohexylnaphthoquinone, 2,3-dichloronaphthoquinone, 5-amino-1,4-naphthoquinone, 4,4'dimethoxy-2,2'-binaphtho-1,1'-diquinone, N-phenyl-p-quinoneimine, N-(4-hydroxyphenyl)-p-quinoneimine, N-(4-dimethylaminophenyl)-p-quinoneimine, N-naphthyl-p-quinoneimine, N-(4-dimethylaminophenyl)-2,6-dichloro-p-quinoneimine, N-(4-dimethylaminophenyl)-2,6-di-t-butyl-p-quinoneimine, N-(4-diethylaminophenyl)-2-methyl-6-t-butyl-p-quinoneimine, N-phenyl-2,6-diethyl-p-quinoneimine, N-phenyl-2,6-di-t-butyl-p- quinoneimine, N-phenyl-2-methoxy-p-quinoneimine, N-(4-dimethylaminophenyl)-2-methoxy-p-quinoneimine, N-(4-dimethylaminophenyl)-naphthoquinoneimine, stilbenequinone, 1-ethyl-4[(4'oxacyclohexa-2', 5'-diethylidene)ethylidene]-1,4-dihydroquinoline, 1-methyl-4[(4'oxacyclohexa-2', 5'-diethylidene)ethylidene]-1,4-dihydropyridine, 2,6-di-t-butyl-4-(3', 5'-di-t-butyl-4-hydroxybenzylidene) cyclohexa-2,5-dien-1-one, 2-t-butyl-6-methyl-4-(3-t-butyl-4-hydroxy-5-methylbenzylidene)cyclohexa-2,5-dien-1-one and 4-(4-hydroxybenzylidene)-benzoquinone.

Besides the above compounds, it is also possible to use as the heat development accelerator a compound with the structure wherein at least one molecule of hydrogen atom has been removed from one molecule of a reducing agent described later.

The heat development accelerator used in the present invention may be made to have both the functions as the accelerator and anti-irradiation dye. This can be achieved by appropriately controlling the light absorption wavelength region of the heat development accelerator.

The photosensitive silver halide contained in the photosensitive material of the present invention may include silver chloride, silver bromide, silver chlorobromide, silver iodobromide and silver chloroiodobromide. These may have been subjected to chemical sensitization or photosensitization carried out on conventional photographic emulsions. As the chemical sensitization, sulfur sensitization, noble metal sensitization or reduction sensitization can be used. As the photo sensitization, a method utilizing conventional sensitizing dyes can be applied.

The sensitizing dyes may include cyanine dyes, merocyanine dyes and trinuclear dyes. They can be exemplified by 3,3'-dicarboxyethyl-2,2'-thiacarbocyanine iodide, 3,3'-diethyl-2,2'-thiacarbocyanine iodide, 3,3'-disulfoethyl-2,2'-thiacarbocyanine iodide, 3,3'-diethyl-2,2'-thiatricarbocyanine iodide, and also dyes with the following structures.

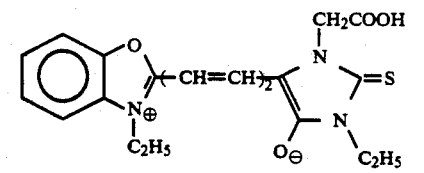

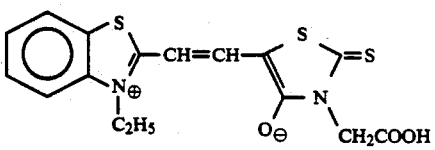

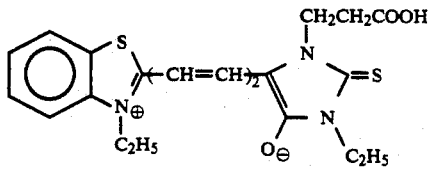

-continued

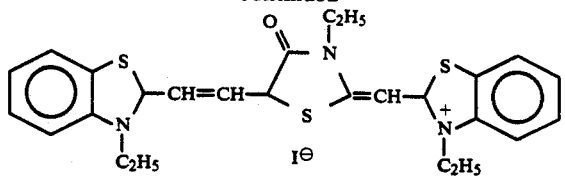

The photosensitive silver halide may have a uniform halogen composition in a particle, or a multiple structure having a different halogen composition in a particle. Two or more kinds of silver halide different in halogen composition, grain size, grain size distribution, etc. may be used in combination.

As the organic silver salt, it is possible to use organic acid silver salts and triazole silver salts as disclosed in SHASHIN KOGAKU NO KISO (Basic Photographic Engineering), First Edition, published by Corona, edited by Japanese Society of Photography, issued 1982, "Non-silver salts", p. 247, or in Japanese Laid-open Patent Application No. 59-55429. It is preferred to use silver salts with a low photosensitivity. They may include, for example, silver salts of aliphatic carboxylic acids, aromatic carboxylic acids, thiocarbonyl compounds having a mercapto group or α-hydrogen, and imino group-containing compounds.

The aliphatic carboxylic acids may include acetic acid, butyric acid, succinic acid, sebacic acid, adipic acid, oleic acid, linoleic acid, linolenic acid, tartaric acid, palmitic acid, stearic acid, behenic acid and camphor acid. In general, silver salts having a smaller number of carbon atoms are proportionally not stable, and hence those having an appropriate number of carbon atoms (e.g., those having 16 to 26 carbon atoms) are preferred.

The aromatic carboxylic acids may include benzoic acid derivatives, quinolinic acid derivatives, naphthalene carboxylic acid derivatives, salicylic acid derivatives, gallic acid, tannic acid, phthalic acid, phenyl acetic acid derivatives, and pyromellitic acid.

The thiocarbonyl compounds having a mercapto group or α-hydrogen may include 3-mercapto-4-phenyl-1,2,4-triazole, 2-mercaptobenzoimidazole, 2-mercapto-5-aminothiadiazole, 2-mercaptobenzothiazole, S-alkylthioglycolic acid (alkyl group carbon atom number of 12 to 23), dithiocarboxylic acids such as dithioacetic acid, thioamides such as thiostearoamide; 5-carboxy-1-methyl-2-phenyl-4-thiopyridine, mercaptotriazine, 2-mercaptobenzoxazole, mercaptodiaoxazole, 3-amino-5-benzylthio-1,2,4-triazole, and mercapto compounds disclosed in U.S. Pat. No. 4,123,274.

The compounds having an imino group may typically include benzotriazole or derivatives thereof, described in Japanese Patent Publication No. 44-30270 or No. 45-18416, as exemplified by benzotriazole, alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles as disclosed in Japanese Laid-open Patent Application No. 58-118639, sulfobenzotriazole, carboxybenzotriazole or salts thereof, or hydroxybenzotriazole, disclosed in Japanese Laid-open Patent Application No. 58-118638, 1,2,4-triazole, disclosed in U.S. Pat. No. 4,220,709, or 1H-tetrazole, carbazole, saccharin, imidazole and derivatives thereof.

The reducing agent used in the present invention is a compound capable of reducing the organic silver salt to form metallic silver, upon heating in the presence of silver nuclei produced as a result of the exposure of a photosensitive silver halide to light. The reducing agent, when used, can be appropriately selected according to the type of the organic silver salt used.

Reducing agents preferably used when the aliphatic silver salts are used as the organic silver salt may include those of the following groups (A) to (G).

(A) o-bisphenols such as 2,2'-methylenebis(4-methyl-6-t-butylphenol), 2,2'-methylenebis(4-ethyl-6-t-butylphenol), 2,2'-methylenebis(4,6-di-t-butylphenol), 2,2'-methylenebis(4,6-dimethylphenol), 2,2'-(3,5,5-trimethylbenzylidene)-bis(4,6-dimethylphenol), and 2,2'-(3,5,5-trimethylbenzylidene)-bis(4,6-di-t-butylphenol).

(B) p-Bisphenols such as 4,4'-methylenebis(2,6-di-t-butylphenol), 4,4'-methylenebis(2-methyl-6-t-butylphenol), 4,4'-butylidenebis(2,6-di-t-butylphenol), 2,6-di-t-butyl-4-(3,5-dimethyl-4-hydroxybenzyl)phenol, 2,6-di-t-butyl-4-(3,5-diethyl-4-hydroxybenzyl)phenol, 2,6-di-t-butyl-4-(3,5-dimethoxy-4-hydroxybenzyl)-phenol, 4,4'-benzylidenebis(2-methyl-6-t-butylphenol), and 4,4'-benzylidenebis(2-methyl-6-cyclohexylphenol).

(C) Phenols such as hydroquinone monomethyl ether, p-aminophenol, propyl gallate, hydroquinone, and 2,6-dichloro-4-benzenesulfonamidophenol.

(D) Binaphthols such as 1,1'-bi-naphthol and 1,1'-bi-4-methyl-2-naphthol.

(E) Bisnaphthols such as 4,4'-methylenebis(2-methyl-1-naphthol), 4,4'-ethylenebis(2-ethyl-1-naphthol), and 4,4'-ethylidenebis(2-methyl-1-naphthol).

(F) Naphthols such as 1-naphthol, 4-chloro-1-naphthol, 4-methyl-1-naphthol, and 4-methoxyl-1-naphthol.

(G) Naphthylmethylphenols such as 2,6-dimethyl-4-(4-hydroxy-3-methylnaphthylmethyl)phenol, 2,6-diethyl-4-(4-hydroxy-3-methylnaphthylmethyl)phenol, 2,6-di-t-butyl-4-(4-hydroxy-3-methylnaphthylmethyl)phenol, 2,6-diethyl-4-(4-hydroxynaphthylmethyl)phenol, and 2-methyl-6-t-butyl-4-(4-hydroxy-3-methylnaphthylmethyl)phenol.

Reducing agents preferably used when the benzotriazole silver salts are used as the organic silver salt may include those of the following groups (H) and (G).

(H) Pyrazolidones such as 1-phenol-3-pyrazolidone.

(I) Ascorbic acids such as ascorbic acid and ascorbic acid monoester.

When any of the reducing agents of the groups (A), (C), (D), (H) and (I) among the above reducing agents is used, it is particularly preferable to use as the heat development accelerator a compound having a redox potential ranging from $-0.2$ V to $+1.0$ V, and more preferably from $-0.2$ V to $+0.8$ V. When any of the reducing agents of the groups (B), (E), (F) and (G) among the above reducing agents is used, it is particularly preferable to use as the heat development accelerator a compound having a redox potential ranging from $-1.2$ V to $+0.3$ V, and more preferably from $-0.8$ V to $+0.3$ V.

The photosensitive material of the present invention may optionally contain a tone modifier as an additive. The tone modifier is used when the metallic silver produced as a result of reduction should be blackened. Effective tone modifiers are chosen depending on the types of the organic silver salt and reducing agent used. Most commonly available tone modifiers can be exemplified by phthalazinones, oxazindiones, cyclic imides, urazoles, 2-pyrazolin-5-ones, quinazolines, N-hydroxynaphthalimides, uracils, phthalazinediones and thiazolinediones.

A binder may also be contained in the photosensitive material of the present invention for the purpose of improving the dispersibility.

The binder may include cellulose esters as exemplified by nitrocellulose, cellulose phosphate, cellulose sulfate, cellulose acetate, cellulose propionate, cellulose butyrate, cellulose myrystate, cellulose palmitate, cellulose acetate.propionate, and cellulose acetate.butyrate; cellulose esters as exemplified by methyl cellulose, ethyl cellulose, propyl cellulose, and butyl cellulose; vinyl resins as exemplified by polystyrene, polyvinyl chloride, polyvinyl acetate, polyvinyl butyral, polyvinyl acetal, polyvinyl alcohol, and polyvinyl pyrrolidone; copolymer resins as exemplified by a styrene/butadiene copolymer, a styrene/acrylonitrile copolymer, a styrene/butadiene/acrylonitrile copolymer, and a vinyl chloride/vinyl acetate copolymer; acrylic resins as exemplified by polymethyl methacrylate, polymethyl acrylate, polybutyl acrylate, polyacrylic acid, polymethacrylic acid, polyacrylamide, and polyacrylonitrile; polyesters as exemplified by polyethylene terephthalate; polyacrylate resins as exemplified by poly(4,4'-isopropylidene, diphenylene-co-1,4-cyclohexylenedimethylene carbonate), poly(ethylenedioxy-3,3'-phenylene thiocarbonate), poly(4,4-isopropylidene diphenylene carbonate-co-terephthalate), poly(4,4'-isopropylidene, diphenylene carbonate), poly(4,4'-sec-butylidene diphenylene carbonate), and poly(4,4'-isopropylidene diphenylene carbonate-block-oxyethylene); polyamides; polyimides; epoxy resins; phenol resins; polyolefins as exemplified by polyethylene, polypropylene, and chlorinated polyethylene; and natural polymers such as gelatin.

In addition, anti-fogging agents, alkali agents, etc. may also be added in the photosensitive material of the present invention.

The above components in the photosensitive material of the present invention may preferably be mixed in the following proportions.

The organic silver salt used may preferably be in an amount of from 0.3 g/m$^2$ to 30 g/m$^2$, particularly preferably 0.7 g/m$^2$ to 15 g/m$^2$, and more preferably 1.2 g/m$^2$ to 8 g/m$^2$.

The photosensitive silver halide should preferably be contained in an amount of from 0.001 mol to 2 mols, and more preferably from, 0.05 mol to 0.4 mol, per mol of the organic silver salt. The reducing agents should preferably be contained in an amount of from 0.05 mol to 3 mols, and more preferably from 0.2 mol to 1.3 mols, per mol of the organic silver salt.

In the present invention, the heat development accelerator may be used in an amount of from 0.0001 mol to 2 mols, preferably from 0.001 mol to 0.7 mol, and more preferably from 0.01 mol to 0.3 mol, per mol of the reducing agent.

When the tone modifier is used, it may be used in an amount ranging from about 0.0001 mol to about 2 mols, and preferably from about 0.0005 mol to about 1 mol, per mol of the organic silver salt.

As the support used in the present invention, extensively various kinds of supports can be used. Typical supports can be exemplified by cellulose nitrate films, cellulose ester films, polyvinylacetal films, polystyrene films, polyethylene terephthalate films, polycarbonate films, and also glass sheets, paper and metal sheets. When an organic solvent is used for an emulsion layer, a support paper subjected to hydrophobic treatment is suitable. It is also suitable to use paper having been sized using a polysaccharide or the like.

The heat-developable photosensitive material of the present invention may be provided with an antistatic layer or a conductive layer. It may also contain an antihalation dye.

The heat-developable photosensitive material used in working the present invention may further optionally contain a matting agent, for example, starch, titanium dioxide, zinc oxide or silica. It may also contain an optical whitening agent, for example, stilbenes, triazines, oxazoles, or coumarin optical whitening agents.

In order to improve transparency, to increase image density, to improve raw stock stability, and in some instances in order to improve heat resistance of the photosensitive material, a photosensitive material layer may optionally be provided thereon with a protective layer. The protective layer may suitably have a layer thickness of from 1 micron to 20 microns. A layer thinner than that may have no effect stated above, and a layer having excessive thickness can give no extra effect, only resulting in a high cost. The protective layer may be comprised of a polymer. Suitable polymers may preferably be those being heat-resistant, colorless and soluble in solvents, and including polyvinyl chloride, polyvinyl acetate, copolymers of vinyl chloride and vinyl acetate (preferably containing 50 mol % or more of vinyl chloride), polyvinyl butyral, polystyrene, polymethyl methacrylate, benzyl cellulose, ethyl cellulose, cellulose acetate-butyrate, cellulose diacetate, cellulose triacetate, polyvinylidene chloride, chlorinated polypropylene, polyvinylpyrrolindine, polyvinylpyrrolidone, cellulose propionate, polyvinyl formal, cellulose acetate butyrate, polycarbonate, and cellulose acetate propionate. It may also include gelatin, gelatin derivatives such as butylated gelatin, acrylamide polymers, polyisobutylene, butadiene-styrene copolymers (with any desired monomer ratio), and polyvinyl alcohol.

Preferable polymers are those having a heat resistance of 115° C. or above, a refractive index of 1.45 or more at 20° C.

In the heat-developable photosensitive material of the present invention, the photosensitive layer, conductive layer, protective layer, etc. can be individually formed, and each of these layers can be provided by various coating processes. Coating processes that form the respective layers can be exemplified by dipping, air-knife coating, curtain coating, and extrusion coating utilizing a hopper as disclosed in U.S. Pat. No. 2,681,294. If necessary, two or more layers can be simultaneously coated.

The heat-developable photosensitive material is subjected to image exposure and heating (heat development), where the organic silver salt and the reducing agent react at the exposed area to cause oxidation-reduction reaction, and a blackened image is formed with the metallic silver produced as a result of the reaction. A pattern corresponding with the difference in light-absorption is also formed utilizing light-absorbing properties of an oxidized product formed by the oxidation-reduction reaction (an oxidized reducing agent). More specifically, the light of a specific wavelength is absorbed at the area where the oxidized agent has been formed (i.e., an image-exposed area) and less absorbed at the area where no oxidized product has been formed (i.e., the unexposed area). Thus there are differences in light-absorption, and a pattern corresponding therewith can be formed.

Utilizing the light-absorbing properties of the oxidized product, the heat-developable photosensitive material of the present invention can form a pattern comprised of a polymerized area and an unpolymerized area (hereinafter "polymerized-unpolymerized pattern"). That is, the photosensitive layer according to the present invention may contain a polymerizable polymer precursor and a photopolymerization initiator, and after the image exposure, by heating (heat development) and polymerization exposure, the polymerized-unpolymerized pattern can be formed. The mechanism by which the polymerized-unpolymerized pattern is formed is as follows; in the area where the oxidized product has been formed no polymerization proceeds because the light is absorbed by the oxidized product, and in the area where the oxidized product has not been formed, the polymerization proceeds.

The polymerizable polymer precursor and the photopolymerization initiator may be contained in the photosensitive layer. Alternatively, a polymerizing layer containing the polymerizable polymer precursor and photopolymerization initiator may be provided separately from the photosensitive layer. The photosensitive layer and the polymerizing layer may be formed in laminae, or they may hold a support between them, one side of which the photosensitive layer is provided and the other side of which the polymerizing layer is provided.

The photopolymerization initiator used in the photosensitive material of the present invention includes, for example, carbonyl compounds, sulfur compounds, halogen compounds, photopolymerization initiators of a redox type, and initiators of a peroxide type sensitized with a dye such as pyrylium.

Stated specifically, the carbonyl compounds may include diketones as exemplified by benzyl, 4,4'-dimethoxybenzyl, diacetyl, and camphorquinone; benzophenones as exemplified by 4,4'-bis(diethylamino)benzophenone, and 4,4'-dimethoxybenzophenone; acetophenones as exemplified by acetophenone, 4-methoxyacetophenone; benzoin alkyl ethers; thioxanthones as exemplified by 2-chlorothioxanthone, 2,4-dichlorothioxanthone, 2,4-diethylthioxanthone, and thioxanthone-3-carboxylic acid-$\beta$-methoxy ethyl ester; chalcones and styrylketones having a dialkylamino group; and coumarins as exemplified by 3,3'-carbonylbis(7-methoxycoumarine), and 3,3'-carbonylbis(7-diethylaminocoumarin).

The sulfur compounds include disulfides as exemplified by dibenzothiazolyl sulfide, and decylphenyl sulfide.

The halogen compounds include, for example, carbon tetrabromide, quinolinesulfonyl chloride, and S-triazines having a trihalomethyl group.

The photopolymerization initiators of redox type include those used in combination of a trivalent iron ionic compound (as exemplified by ferric ammonium citrate) with a peroxide, and those used in combination of a photoreducible coloring substance, such as riboflavin or methylene blue with a reducing agent such as triethanolamine or ascorbic acid.

In the photopolymerization initiator described above, two or more photopolymerization initiators can also be used in combination for a more efficient photopolymerization reaction.

Such combination of the photopolymerization initiators includes a combination of chalcones having a dialkylamino group and styrylketones or coumarins, with S-triazines having a trihalomethyl group or camphorquinone.

As the polymerizable polymer precursor used for the photosensitive material of the present invention, a compound having at least one reactive vinyl group in its molecule can be utilized.

The reactive vinyl group in these compounds may include substituted or unsubstituted vinyl groups having polymerization reactivity, as exemplified by styrene vinyl groups, acrylic acid vinyl groups, methacrylic acid vinyl groups, allyl vinyl groups, and vinyl ethers, as well as ester vinyl groups such as vinyl acetate.

Specific examples of the polymerizable polymer precursor satisfying such conditions are as follows.

They may include monovalent monomers as exemplified by styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, 2-vinylimidazole, N-methyl-2-vinylimidazole, propyl vinyl ether, butyl vinyl ether, isobutyl vinyl ether, β-chloroethyl vinyl ether, phenyl vinyl ether, p-methylphenyl vinyl ether, and p-chlorophenyl vinyl ether; divalent monomers as exemplified by divinylbenzene, distyryl oxalate, distyryl malonate, distyryl succinate, distyryl glutarate, distyryl adipate, distyryl maleate, distyryl fumarate, distyryl β,β'-dimethylglutarate, distyryl 2-bromoglutarate, distyryl α, α'-dichloroglutarate, distyryl terephthalate, oxalic acid di(ethyl acrylate), oxalic acid di(methyl ethyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(ethyl acrylate), fumaric acid di(ethyl acrylate), β,β'-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxymethyl ethyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene, 1,4-bis(acryloyloxyethoxycarbamoyl)cyclohexane, bis(acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), β,β'-dimethylglutaric acid di(ethyl methacrylate), 1,4-phenylenebis(oxyethyl methacrylate), and 1,4-bis(methacryloyloxyethoxy) cyclohexane acryloyloxyethoxyethyl vinyl ether; trivalent monomers as exemplified by pentaerythritol triacrylate, pentaerythritol trimethacrylate, pentaerythritol tri(hydroxystyrene), cyanuric acid triacrylate, cyanuric acid trimethacrylate, 1,1,1-trimethylolpropane triacrylate, 1,1,1-trimethylolpropane trimethacrylate, cyanuric acid tri(ethyl acrylate), 1,1,1-trimethylolpropane tri(ethyl acrylate), cyanuric acid tri(ethyl vinyl ether), a condensate of 1,1,1-trimethylolpropanetri(toluenediisocyanate) with hydroxyethyl acrylate, and a condensate of 1,1,1-trimethylolpropanetri(hexanediisocyanate) with p-hydroxystyrene; tetravalent monomers as exemplified by ethylenetetraacrylamide, and propylenetetraacrylamide; and hexavalent monomers such as dipentaerythritol hexaacrylate.

The above polymerizable polymer precursors may be used in combination of two or more kinds.

When the polymerizable polymer precursor and the photopolymerization initiator are contained in the heat-developable photosensitive material of the present invention, the photopolymerization initiator may preferably be contained in an amount of from 0.01 mol to 10 mols, and more preferably from 0.5 mol to 3.0 mols, per mole of the reducing agent. The initiator should also be in an amount of from 0.1 part by weight to 30 parts by weight, and preferably from 0.5 part by weight to 10 parts by weight, based on 100 parts by weight of the polymerizable polymer precursor.

The photosensitive layer may preferably have a thickness of from 0.1 μm to 50 μm, more preferably from 1 μm to 30 μm, and particularly preferably from 2 μm to 20 μm. When the polymerizing layer is provided separately from the photosensitive layer, the polymerizing layer may have the thickness in the same range as the range of the thickness of the photosensitive layer.

As light sources uses in the steps of image exposure and polymerization exposure, various light sources, for example, sunlight, tungsten lamps, mercury lamps, halogen lamps, xenon lamps, fluorescent lamps, LEDs, and lasers can be used, and the wavelength of the light used in these steps may be the same or different. Even if the light having the same wavelength is used, the latent image can be sufficiently formed using the light of an intensity which does not cause photopolymerization in the step of image exposure, since the silver halide usually has a sufficiently higher photosensitivity than the photopolymerization initiator. For example, in the step of image exposure, the exposure may be carried out with the light intensity of about 1 mJ/cm$^2$ or less at the surface of the photosensitive material. In the step of polymerization exposure, the exposure may be carried out with the light intensity of about 500 mJ/cm$^2$ or less at the surface of the photosensitive material.

Various means are available as a means for the heat-developing of the photosensitive material of the present invention. For example, the photosensitive material may be brought into contact with a simple heating plate. Alternatively, it may be brought into contact with a heated drum. In some instances, it may also be passed through a heated space. It may also be heated by high-frequency heating or laser beams. It is suitable to carry out the heating at a temperature of from 80° C. to 160° C., preferably from 100° C. to 160° C., and more preferably from 100° C. to 140° C. The heating time may be elongated or shortened, whereby a higher temperature or lower temperature within the above range can be used. Developing time may be usually from about 1 second to about 60 seconds, and preferably from 3 seconds to 20 seconds.

According to the heat-developable photosensitive material of the present invention, as described above, the photographic processing time can be shortened, and an image with high γ (gamma), that is, an image with a low fog density and a high density in the image area can be obtained.

The present invention will be specifically described below by giving Examples. In the following, "part(s)" indicates "part(s) by weight".

EXAMPLES 1 AND 2, COMPARATIVE EXAMPLE 1

Dispersion A of the following composition was prepared using a homomixer under safelight.

| | |
|---|---|
| Polyvinyl butyral | 3.0 parts |
| Silver behenate | 2.5 parts |
| Silver bromide | 0.5 part |
| Behenic acid | 1.0 parts |
| Homophthalic acid | 0.3 part |
| Phthalazinone | 0.5 part |
| 2,6-di-t-Butyl-4-(3,5-dimethyl-4-hydroxybenyl)phenol | 2.3 parts |
| Xylene | 30 parts |
| n-Butanol | 30 parts |

To this dispersion A, 0.03 part of p-benzoquinone as shown in Table 1 was added as a development accelerator. Thereafter, the dispersion was applied on a 12 μm thick polyethylene terephthalate (PET) film to form a photosensitive layer of 4 μm thick when dried. On this photosensitive layer, a polyvinyl alcohol layer as a protective layer was provided in a dried-coating thickness of 2 μm. On the opposite side of this polyethylene terephthalate film, a polymerizing layer solution of the following composition was applied and dried in a dried-coating thickness of 3 μm. Photosensitive material A of the present invention was thus produced (Example 1).

| | |
|---|---|
| Chlorinated rubber (907LTA, trade name; available from Sanyo-Kokusaku Pulp Co., Ltd.) | 4.0 parts |
| Polymethyl methacrylate (Elbasite 2041) | 2.0 parts |
| Kayarad DPHA | 20. parts |
| Trimethylolpropane triacrylate | 2.0 parts |
| Kayacure DETX | 0.6 part |
| Kayacure EPA | 0.6 part |
| Methyl ethyl ketone | 40 parts |
| Xylene | 10 parts |

Photosensitive material B of the present invention was also prepared in the same manner as photosensitive material A except that 0.03 part of N-(4-dimethylaminophenyl)-2,6-di-t-butyl-p-quinoneimine was used as a development accelerator in place of p-benzoquinone, as shown in Table 1 (Example 1).

Photosensitive material C was also prepared in the same manner as photosensitive material A except that the development accelerator was not contained. The redox potential (on the basis of AgCl/Ag electrode) of each of the development accelerators respectively used in photosensitive materials A and B is as shown in Table 1.

TABLE 1

| Photosensitive material | Development accelerator | Redox potential (V) |
|---|---|---|
| Example: | | |
| 1 | A | p-Benzoquinone | −0.16 |
| 2 | B | N-(4-dimethylaminophenyl)-2,6-di-t-butyl-p-quinoneimine | −0.64 |
| Comparative Example: | | |
| 1 | C | None | — |

Measured data of the redox potential of the development accelerator added to photosensitive material A is shown in FIG. 1. Description follows with reference to FIG. 1.

When the initial potential is set to +0.5 V and sweeping is carried out in the minus direction at a sweeping speed of 100 mV/sec, peak A appears at −0.16 V (vs. AgCl/Ag) which results from the following reduction reaction.

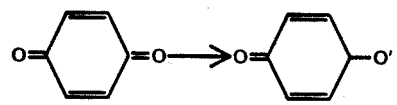

Peak B that appears at −0.08 V(vs. AgCl/Ag) when the sweeping was reversed from −0.4 V in the plus direction at a scanning speed of 100 mV/sec results from the following oxidation reaction.

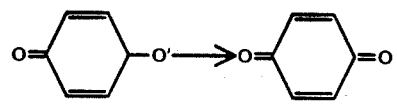

The redox potential in the present invention refers to the potential of this peak A, which is −0.16 V in the case of p-benzoquinone.

Onto each polymerizing layer of the photosensitive materials A, B and C, a polyimide film with a thickness of 50 [μm was laminated. Then each photosensitive material was image-exposed for 15 seconds using a tungsten lamp from the photosensitive layer side, followed by heat development for 10 seconds using a heat developer set to a temperature of 115° C. The intensity of the tungsten lamp was 1,000 lux.

Next, the whole surface of the photosensitive layer of each photosensitive material was exposed to the light for 10 seconds for the polymerization exposure, using a fluorescent lamp having an emission peak at 400 nm. Thereafter, the PET film was peeled from the polyimide film.

As a result, for the photosensitive materials A and B each, the unpolymerized area of the polymerizing layer remained on the PET film, and the polymerized area of the polymerizing layer remained on the polyimide film, each forming a pattern.

On the contrary, in the photosensitive material C, the whole polymerizing layer almost polymerized, and no polymerized-unpolymerized pattern was obtained.

Then, the photosensitive materials A, B and C were afresh prepared, and these photosensitive materials were again subjected to the image exposure and heat development under the same conditions, then without polymerization exposure, the polymerizing layer was washed off. Of each photosensitive layer of the photosensitive materials A, B and C thus processed, optical density at 400 nm was measured. As a result, the photosensitive material C showed a substantially low optical density at its image-exposed areas, compared with the photosensitive materials A and B.

EXAMPLE 3, COMPARATIVE EXAMPLES 2 AND 3

Dispersion B of the following composition was prepared using a homomixer under the safelight.

| | |
|---|---|
| Polyvinyl butyral | 1.5 parts |

| | |
|---|---|
| Polymethyl methacrylate | 1.0 part |
| Silver behenate | 2.0 parts |
| Silver bromide | 0.6 part |
| Behenic acid | 1.2 parts |
| Azelaic acid | 0.3 part |
| Phthalazinone | 0.3 part |
| 4,4'-Methylenebis(2,6 di-t-butylphenol) | 2.3 parts |
| Xylene | 30 parts |
| n-Butanol | 30 parts |

To this dispersion B, 0.003 part of a sensitizing dye of the following structure (1) dissolved in 0.2 part of N,N-dimethylformamide was added, and 0.04 part of a development accelerator with the following structure (2) was added to give the dispersion C.

Photosensitive material D of the present invention (Example 3) was prepared, in the same manner as for the photosensitive material A except that the photosensitive layer was formed using the above dispersion C. The redox potential (on the basis of AgCl/Ag electrode) of the development accelerator with the structure (2) was $-0.54$ V.

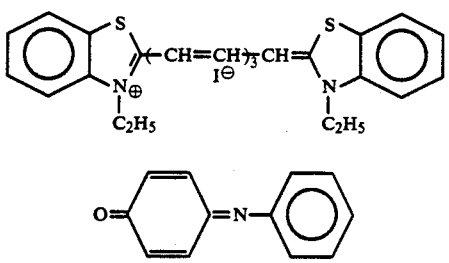

(1)

(2)

Photosensitive material E (Comparative Example 2) was also prepared in the same manner as the photosensitive material D except that no development accelerator was contained.

Photosensitive material F (Comparative Example 3) was further produced in the same manner as the photosensitive material D except that 0.03 part of a development accelerator of the following structure (3) was used in place of 0.04 part of the development accelerator of the structure (2). The redox potential (on the basis of AgCl/Ag electrode) of the development accelerator with the following structure (3) was $+1.21$ V.

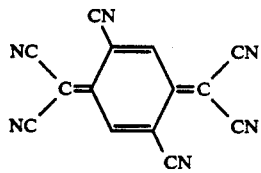

(3)

Onto each polymerizing layer of the photosensitive materials D, E and F, a polyimide film with a thickness of 50 μm was laminated. Thereafter, each photosensitive material was image-exposed at an energy level of 100 μJ/cm² from the photosensitive layer side, using a semiconductor laser of 780 nm in wavelength, then heat developed for 10 seconds at 120° C. Next, each photosensitive material was subjected to polymerization exposure in the same manner as in Example 1. Thereafter, the PET film was peeled from the polyimide film.

As a result, in the photosensitive material D, a pattern of unpolymerized areas of the polymerizing layer remained on the PET film, and a pattern of polymerized areas of the polymerizing layer remained on the polyimide film.

In the photosensitive material E, the whole polymerizing layer was almost polymerized, and no polymerized-unpolymerized pattern was obtained. Also in the photosensitive material F, the polymerizing layer only slightly polymerized, and no polymerized-unpolymerized pattern was obtained.

As in Example 1, for each photosensitive layer of the photosensitive materials D, E and F, optical density at 400 nm was measured. As a result, it was confirmed that in the photosensitive material E the optical density of the image-exposed area was lower than that in the photosensitive material D, and in the photosensitive material F the optical density of the image-exposed area was slightly low but high at the unexposed areas, compared with the photosensitive material D, thus causing serious fogging.

It was found from the foregoing results that the photosensitive materials of the present invention can give images with good contrast even when the spectral sensitization was carried out.

EXAMPLES 4 AND 5, COMPARATIVE EXAMPLE 4

Dispersion D of the following composition was prepared using a homomixer under the safelight.

| | |
|---|---|
| Polyvinyl butyral | 1.5 parts |
| Polymethyl methacrylate | 1.0 part |
| Silver behenate | 2.0 parts |
| Silver bromide | 0.6 part |
| Behenic acid | 1.2 parts |
| Azelaic acid | 0.3 part |
| Phthalazinone | 0.3 part |
| 2,2'-Methylenebis(4,6-di-t-butylphenol) | 2.4 parts |
| Xylene | 30 parts |
| n-Butanol | 30 parts |

To this dispersion D, 0.006 part of the sensitizing dye of the structure (1), used in Example 3, dissolved in 1.5 parts of methanol was added, and 0.03 part of bromanil as shown in Table 2 was added as a development accelerator to give the dispersion E.

The dispersion E thus obtained was applied on a 50 μm thick PET film to give a dried-coating thickness of 12 μm to form a photosensitive layer. On this photosensitive layer, a polyvinyl alcohol layer was provided as a protective layer in a dried-coating thickness of 2 μm. Photosensitive material G of the present invention was thus produced (Example 4).

Photosensitive material H of the present invention (Example 5) was also prepared in the same manner as the photosensitive material G except that 0.03 part of 2,3-dicyano-5,6-dichloro-benzoquinone as shown in Table 2 was used in place of 0.03 part of the development accelerator bromanil.

Photosensitive material I (Comparative Example 4) was prepared in the same manner as the photosensitive material G except that no development accelerator was contained. The redox potential (on the basis of AgCl/Ag electrode) of each of the development accelerators used in the photosensitive materials G and H is shown in Table 2.

TABLE 2

| | Photosensitive material | Development accelerator | Redox potential (V) |
|---|---|---|---|
| Example: | | | |
| 4 | G | Bromanil | +0.40 |
| 5 | H | 2,3-Dicyano-5,6-dichloro-benzoquinone | +0.86 |
| Comparative Example: | | | |
| 4 | I | None | — |

The photosensitive materials G, H and I thus obtained were each subjected to image exposure using a semiconductor laser of 780 nm in wavelength, then heat developed at 113° C. for 10 seconds. As a result, black and white images were formed on all the photosensitive materials.

By changing irradiation energy of the semiconductor laser, black and white images were formed on the photosensitive materials without changing the heat development conditions of 113° C. and 10 seconds. Optical density at 550 nm was measured at the image-exposed area of the photosensitive material. This measurement of optical density was carried out on all the photosensitive materials G, H and I. Results of the measurement are graphed in FIG. 2.

Figure 2:
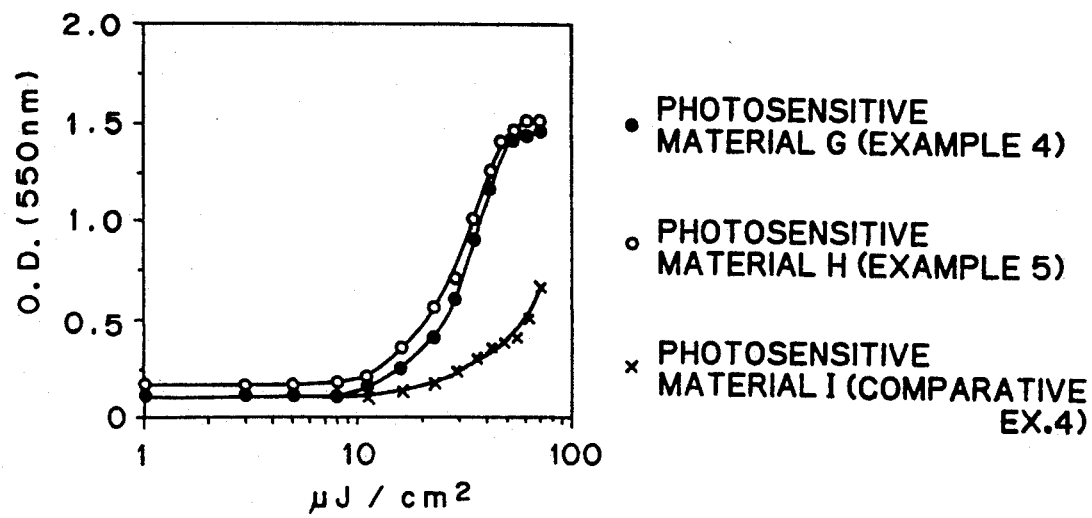
FIG. 2 is a graph to show the relationship of image exposure energy and optical density in regard to each of heat-developable photosensitive materials obtained in Examples 4 and 5 and Comparative Example 4.

As is clear from FIG. 2, the maximum density and gamma of the photosensitive materials G and H were higher and more excellent than those of the photosensitive material I.

EXAMPLE 6

Photosensitive material J was prepared in the same manner as in Example 1 except that, 7-methoxybenzoxazinedione was used in the dispersion A in place of 0.5 part of the tone modifier phthalazinone.

Onto the polymerizing layer of photosensitive material J, a polyimide film was laminated, followed by exposure, heat development, and then overall (whole areal) exposure to carry out polymerization exposure, in the same manner as in Example 1. The PET film was peeled from the polyimide film. As a result, a good polymerized-unpolymerized pattern was obtained as in Example 1.

An accelerated aging test was also carried out on the photosensitive material J. The accelerated aging test was carried out by leaving a raw (unused) photosensitive material J in an environment of a temperature of 50° C. and a humidity of 70% RH for 30 hours, and thereafter forming thereon the polymerized-unpolymerized pattern in the same manner as in Example 1. As a result, a good polymerized-unpolymerized pattern was obtained even after the photosensitive material was left in the environment of a temperature of 50° C. and a humidity of 70% RH for 30 hours.

EXAMPLES 7 AND 8, COMPARATIVE EXAMPLE 5

To the dispersion D prepared in Example 4, 0.001 part of a sensitizing dye of the following structure (4) dissolved in 0.499 part of N,N-dimethylformamide was added, and then 0.03 part of chloranil as shown in Table 3 was added as a development accelerator to give the dispersion F.

Photosensitive material K of the present invention (Example 7) was prepared in the same constitution as the photosensitive material G except that the photosensitive layer was formed using the above dispersion F.

Photosensitive material L of the present invention (Example 8) was also produced in the same manner as the photosensitive material K except that 0.03 part of 2,6-dichloro-p-benzoquinone as shown in Table 3 was used in place of 0.03 part of the development accelerator, chloranil.

Photosensitive material M (Comparative Example 4) was produced in the same manner as the photosensitive material K except that no development accelerator was contained. The redox potentials (on the basis of AgCl/Ag electrode) of the development accelerators used respectively in the photosensitive materials K and L are as shown in Table 3.

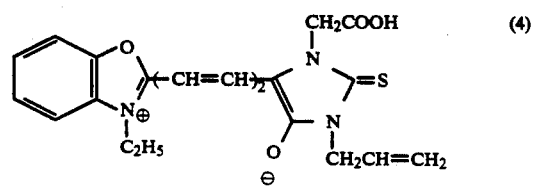

TABLE 3

| | Photosensitive material | Development accelerator | Redox potential (V) |
|---|---|---|---|
| Example: | | | |
| 7 | K | Chloranil | +0.38 |
| 8 | L | 2,6-Dichloro-p-benzoquinone | +0.22 |
| Comparative Example: | | | |
| 5 | M | None | — |

The photosensitive materials K, L and M thus obtained were each subjected to image exposure using a He-Ne laser of 633 nm in wavelength, then heat developed at 113° C. for 10 seconds. As a result, black and white images were formed on all the photosensitive materials.

By changing irradiation energy of the He-Ne laser to various values, black and white images were formed in the photosensitive materials without changing the heat development conditions of 113° C. and 10 seconds. Optical density at 550 nm was measured on the imagewise exposed area of the photosensitive material. Optical density was measured on all the photosensitive materials K, L and M. Results of the measurement are graphed in FIG. 3.

Figure 3:
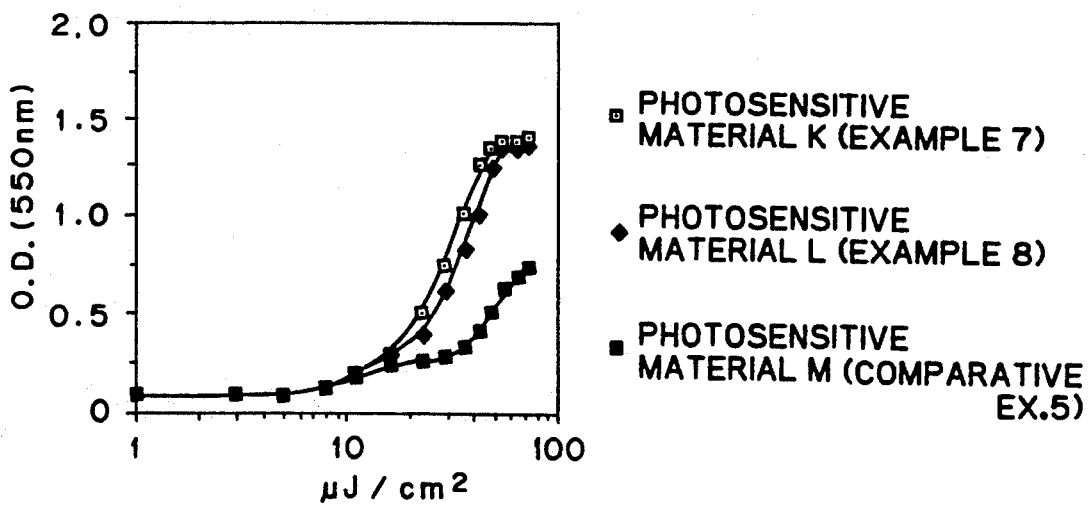
FIG. 3 is a graph to show the relationship of image exposure energy and optical density in regard to each of heat-developable photosensitive materials obtained in Examples 7 and 8 and Comparative Example 5.

As is clear from FIG. 3, both the maximum density and gamma of the photosensitive materials K and L were higher and more excellent than those of the photosensitive material M.

EXAMPLE 9, COMPARATIVE EXAMPLE 6

Dispersion G of the following composition was prepared using a homomixer under the safelight.

| | |
|---|---|
| Polyvinyl butyral | 5.0 parts |
| Silver laurate | 3.0 parts |
| Lauric acid | 3.0 parts |
| Silver bromide | 0.4 part |
| 4,4'-Methylenebis(2,6-di-t-butylphenol) | 2.6 parts |
| 7-Methylbenzoxazinedione | 0.5 part |
| Toluene | 40 parts |
| i-Propanol | 40 parts |

To this dispersion G, 0.03 part of a development accelerator of the following structure (5) was added to give the dispersion H.

Photosensitive material N of the present invention (Example 9) was produced, having the same constitution as the photosensitive material A except that the photosensitive layer was formed using the above dispersion H. The redox potential (on the basis of AgCl/Ag electrode) of the development accelerator of the structure (5) was −0.44 V.

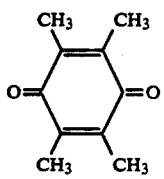

(5)

Photosensitive material O (Comparative Example 9) was also produced in the same manner as the photosensitive material N except that no development accelerator was contained.

A polyimide film was laminated to the polymerizing layer of the photosensitive materials N and O thus obtained, followed by exposure, heat development, and then overall (whole areal) exposure to carry out polymerization exposure, in the same manner as in Example 1 except that the heat development was carried out at a temperature of 120° C. Then the PET film was peeled from the polyimide film of each photosensitive material. As a result, a good polymerized-unpolymerized pattern was obtained in the photosensitive material N. In the photosensitive material O, however, the whole polymerizing layer almost polymerized, and no polymerized-unpolymerized pattern was obtained.

What is claimed is:

1. A heat-developable photosensitive material comprising a support and a photosensitive layer provided thereon, wherein said photosensitive layer comprises:
   (a) a silver halide which forms silver nuclei upon exposure to light;
   (b) an organic silver salt which forms metallic silver upon heating in the presence of said silver nuclei;
   (c) a reducing agent which reduces said organic silver salt to metallic silver by a redox reaction upon heating;
   (d) a sensitizing dye which absorbs light to increase the light sensitivity of said silver halide; and
   (e) a heat development accelerator having a redox potential ranging from −1.2 V to +1.0 V on the basis of an AgCl/Ag electrode to potentiate the oxidation of the reducing agent and to promote the formation of said metallic silver.

2. The heat-developable photosensitive material according to claim 1, wherein said heat development accelerator has a redox potential ranging from −0.8 V to +0.8 V.

3. The heat-developable photosensitive material according to claim 1, wherein said heat development accelerator has a dienone structure.

4. The heat-developable photosensitive material according to claim 3, wherein the compound having the dienone structure is a quinoid.

5. The heat-developable photosensitive material according to claim 4, wherein said quinoid is a quinone or a quinoneimine.

6. The heat-developable photosensitive material according to claim 1, wherein said heat development accelerator is a compound represented by any one of Formulas (I), (II) and (III).

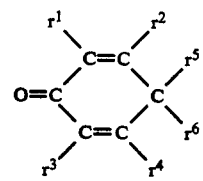

(I)

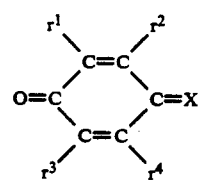

(II)

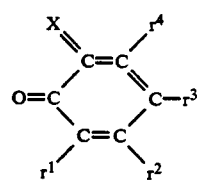

(III)

wherein $r^1$, $r^2$, $r^3$, $r^4$, $r^5$ and $r^6$ each independently represent a hydrogen atom, a halogen atom, a substituted or unsubstituted alkyl group, a substituted or unsubstituted aryl group, a substituted or unsubstituted cycloalkyl group, a substituted or unsubstituted aralkyl group, a substituted or unsubstituted alkoxyl group, a substituted or unsubstituted amino group or a cyano group, and $r^1$ and $r^2$, or $r^3$ and $r^4$, may together form a ring structure; and X represents an oxygen atom, a substituted nitrogen or a substituted carbon atom.

7. The heat-developable photosensitive material according to claim 1, wherein said reducing agent is selected from the group consisting of o-bisphenols, phenols, binaphthols, pyrazolidones and ascorbic acids; and said heat development accelerator has a redox potential ranging from −0.2 V to +1.0 V.

8. The heat-developable photosensitive material according to claim 7, wherein said heat development accelerator has a redox potential ranging from −0.2 V to +0.8 V.

9. The heat-developable photosensitive material according to claim 1, wherein said reducing agent is selected from the group consisting of p-bisphenols, bisnaphthols, naphthols and naphthylmethylphenols; and said heat development accelerator has a redox potential ranging from −1.2 V to +0.3 V.

10. The heat-developable photosensitive material according to claim 9, wherein said heat development accelerator has a redox potential ranging from −0.8 V to +0.3 V.

11. The heat-developable photosensitive material according to claim 1, wherein said photosensitive layer further comprises a polymerizable polymer precursor and a photopolymerization initiator.

12. The heat-developable photosensitive material according to claim 1, which comprises a polymerizing layer comprising a polymerizable polymer precursor and a photopolymerization initiator.

* * * * *

UNITED STATES PATENT AND TRADEMARK OFFICE
CERTIFICATE OF CORRECTION

PATENT NO. : 5,258,281
DATED : November 2, 1993
INVENTOR(S) : HIROMI TANAKA, ET AL.

It is certified that error appears in the above-indentified patent and that said Letters Patent is hereby corrected as shown below:

COLUMN 1

Line 25, "Researchers" should read --Researches--.

COLUMN 3

Line 50, "secamyl," should read --sec-amyl,--.

COLUMN 9

Line 35, "polyvinylpyrroli-" should be deleted.
Line 36, "done," should be deleted.

COLUMN 10

Line 49, "bis(7-methoxycoumarine)," should read --bis(7-methoxycoumarin),--.

COLUMN 12

Line 29, "uses" should read --used--.

UNITED STATES PATENT AND TRADEMARK OFFICE
CERTIFICATE OF CORRECTION

PATENT NO. : 5,258,281
DATED : November 2, 1993
INVENTOR(S) : HIROMI TANAKA, ET AL It is certified that error appears in the above-indentified patent and that said Letters Patent is hereby corrected as shown below:

COLUMN 14

Line 30, "50 [μm" shoul dread --50 μm--.

Signed and Sealed this

Thirty-first Day of May, 1994

Attest:

BRUCE LEHMAN

Attesting Officer    Commissioner of Patents and Trademarks